(12) United States Patent
Wheat et al.

(10) Patent No.: US 6,706,323 B2
(45) Date of Patent: Mar. 16, 2004

(54) METHOD FOR MASKING MULTIPLE TURBINE COMPONENTS

(75) Inventors: Gary E. Wheat, Madisonville, KY (US); Terry K. Brown, Central City, KY (US); Steve E. Bauer, Madisonville, KY (US)

(73) Assignee: General Electric Company, Schenectady, NY (US)

( * ) Notice: Subject to any disclaimer, the term of this patent is extended or adjusted under 35 U.S.C. 154(b) by 155 days.

(21) Appl. No.: 10/109,520

(22) Filed: Mar. 28, 2002

(65) Prior Publication Data

US 2002/0098284 A1 Jul. 25, 2002

Related U.S. Application Data

(62) Division of application No. 09/545,542, filed on Apr. 7, 2000.

(51) Int. Cl.⁷ .................... C23C 16/00; B05D 1/32; B05D 5/00
(52) U.S. Cl. .............. 427/248.1; 427/250; 427/282
(58) Field of Search .................. 427/248.1, 250, 427/282, 255.294, 255.28; 118/720, 721, 500, 504, 505, 728

(56) References Cited

U.S. PATENT DOCUMENTS

| 4,271,005 A | | 6/1981 | Wright et al. |
| 4,485,759 A | | 12/1984 | Brandolf |
| 4,671,968 A | | 6/1987 | Slominski |
| 5,128,179 A | | 7/1992 | Baldi |
| 5,630,879 A | | 5/1997 | Eichmann et al. |
| 5,792,267 A | | 8/1998 | Marszal et al. |
| 6,037,004 A | * | 3/2000 | Zajchowski et al. ........ 427/282 |
| 6,039,810 A | | 3/2000 | Mantkowski et al. |
| 6,224,673 B1 | * | 5/2001 | Das et al. .................. 118/500 |

FOREIGN PATENT DOCUMENTS

GB 2210387 6/1989

* cited by examiner

Primary Examiner—Timothy Meeks
Assistant Examiner—Eric B. Fuller
(74) Attorney, Agent, or Firm—V. G. Ramaswamy; Senniger, Powers, Leavitt & Roedel

(57) ABSTRACT

Method to facilitate vapor phase coating of turbine airfoils. A dovetail receptacle receives the dovetails of a plurality of airfoils. The airfoils are separated by spacers with the airfoil dovetails sealed in a chamber of the receptacle to facilitate vapor phase coating of airfoil flowpath surfaces and platform upper surfaces of several airfoils simultaneously while masking the dovetail sections.

15 Claims, 5 Drawing Sheets

METHOD FOR MASKING MULTIPLE TURBINE COMPONENTS

CROSS-REFERENCE TO RELATED APPLICATION

This application is a divisional of Ser. No. 09/545,542, filed Apr. 7, 2000.

BACKGROUND OF THE INVENTION

This invention relates to coating gas turbine engine airfoils and, more particularly, to a method for masking airfoils during coating to prevent deposition of coating onto selected surfaces of such airfoils.

To provide protection against high temperatures and corrosive effects of hot gases in gas turbine engines, turbine airfoils have been subjected to aluminide coating. Aluminide coating on the flowpath surfaces, platform, angel wing and respective edges provides oxidation and corrosion resistance and enhances the performance life of the airfoil component. It is preferable, however, to avoid coating the dovetail section below the platform of turbine airfoil components because coating can adversely affect fatigue life of the dovetail section. Furthermore, coating the dovetail section is not necessary because in service this section is not in the hot gas flowpath, as is the airfoil section. It is therefore necessary to mask certain sections of the component to prevent coating such sections while allowing coating of other sections.

Two methods for coating turbine airfoils are a codeposition process and a vapor phase aluminide process. These are diffusion coating processes which use aluminum fluoride ($AlF_3$) gas to apply an oxidation-/corrosion-resistant, aluminum-rich layer to the component surface. The codeposition process involves sequential steps of degrease, tape and seal holes, wax, load box, slurry, seal, pack, run, unload and blowoff, water clean, and age. This process utilizes an activated Al-rich powder packed tightly around the airfoil section to facilitate coating while the areas below the platform are packed with an inert powder containing calcined alumina and concentrations of $Ni^{+2}$ and $Cr^{+3}$ similar to the parent metal to avoid possible coating, as well as alloy depletion and inter-granular attack. The process yields an aluminide coating that is brittle yet functional for prohibiting corrosion. This process is labor-intensive and operator-dependent, and tends to plug cooling holes and leave excessive amounts of foreign material on the airfoils. It also requires a final heat treatment, without which the coating is too brittle.

The vapor phase aluminide process yields a ductile aluminide coating which requires minimal final heat treatment. The vapor phase aluminide process does not require blowoff or water cleaning operations, thus reducing labor and material costs. One disadvantage of this process, however, is that coating must be removed from the dovetail sections by grinding, and such grinding also removes the beneficial platform edge and angel wing edge coating Thus, there is a need for an effective masking technique that facilitates secure masking of a plurality of turbine airfoil components during vapor phase diffusion coating processes.

SUMMARY OF THE INVENTION

Briefly, the invention is directed to a method for simultaneously vapor phase coating airfoil flowpath surfaces and upper platform surfaces of a plurality of turbine airfoils while masking dovetail sections of the turbine airfoils. The method involves inserting dovetail sections of a plurality of turbine airfoils into a dovetail section receptacle which has a chamber with an opening at the top of the receptacle for insertion of multiple turbine airfoil dovetail sections into the chamber, and a rim around the opening, the rim being sized for supporting the platforms of the turbine airfoils, such that the dovetail section of each turbine airfoil extends into the chamber and the platform of each turbine airfoil rests on the rim, with upper platform surfaces and airfoil flowpath surfaces external to the receptacle. The method further involves inserting a spacer adjacent each platform of the turbine airfoils to prevent adjacent platforms from contacting each other, placing the dovetail section receptacle with dovetail sections and spacers therein into a coating apparatus, and introducing coating vapor into the coating apparatus to form a coating on the airfoil flowpath surfaces and upper platform surfaces external to the dovetail receptacle while avoiding coating of the dovetail sections inside the chamber.

The invention is also directed to a dovetail section receptacle apparatus for use in vapor phase diffusion coating of airfoil flowpath surfaces and upper platform surfaces of a plurality of turbine airfoils, while avoiding coating of dovetail sections. The apparatus includes a dovetail section receptacle for receiving dovetail sections of a plurality of turbine airfoils arranged side-by-side. The receptacle has a chamber having an opening at the top of the receptacle for insertion of multiple turbine airfoil dovetail sections into the chamber, and a rim around the opening, the rim being sized for supporting the platforms of the turbine airfoils side-by-side. The apparatus further includes a plurality of spacers for placement adjacent each platform of the turbine airfoils to prevent pairs of adjacent platforms from contacting each other.

In another aspect the invention is directed to a turbine airfoil coating assembly for vapor phase diffusion coating of airfoil flowpath surfaces and platform upper surfaces of turbine airfoils while avoiding coating of dovetail sections thereof. The assembly includes a plurality of turbine airfoils, each having a flowpath surface, a platform having a platform upper surface, and a dovetail section. There is a dovetail section receptacle for receiving dovetail sections of the plurality of turbine airfoils arranged side-by-side, the dovetail section receptacle having a chamber with an opening having a perimeter at the top of the receptacle for insertion of multiple turbine airfoil dovetail sections into the chamber. There is a rim around the opening, the rim being sized for supporting the platforms of the turbine airfoils, such that the dovetail section of each turbine airfoil extends into the chamber and the platform of each turbine airfoil rests on the rim, with upper platform surfaces and flowpath surfaces external to the receptacle. There is a plurality of spacers, with a spacer adjacent each platform of the turbine airfoils to prevent adjacent platforms from contacting each other.

DETAILED DESCRIPTION OF THE INVENTION

Figure 1:
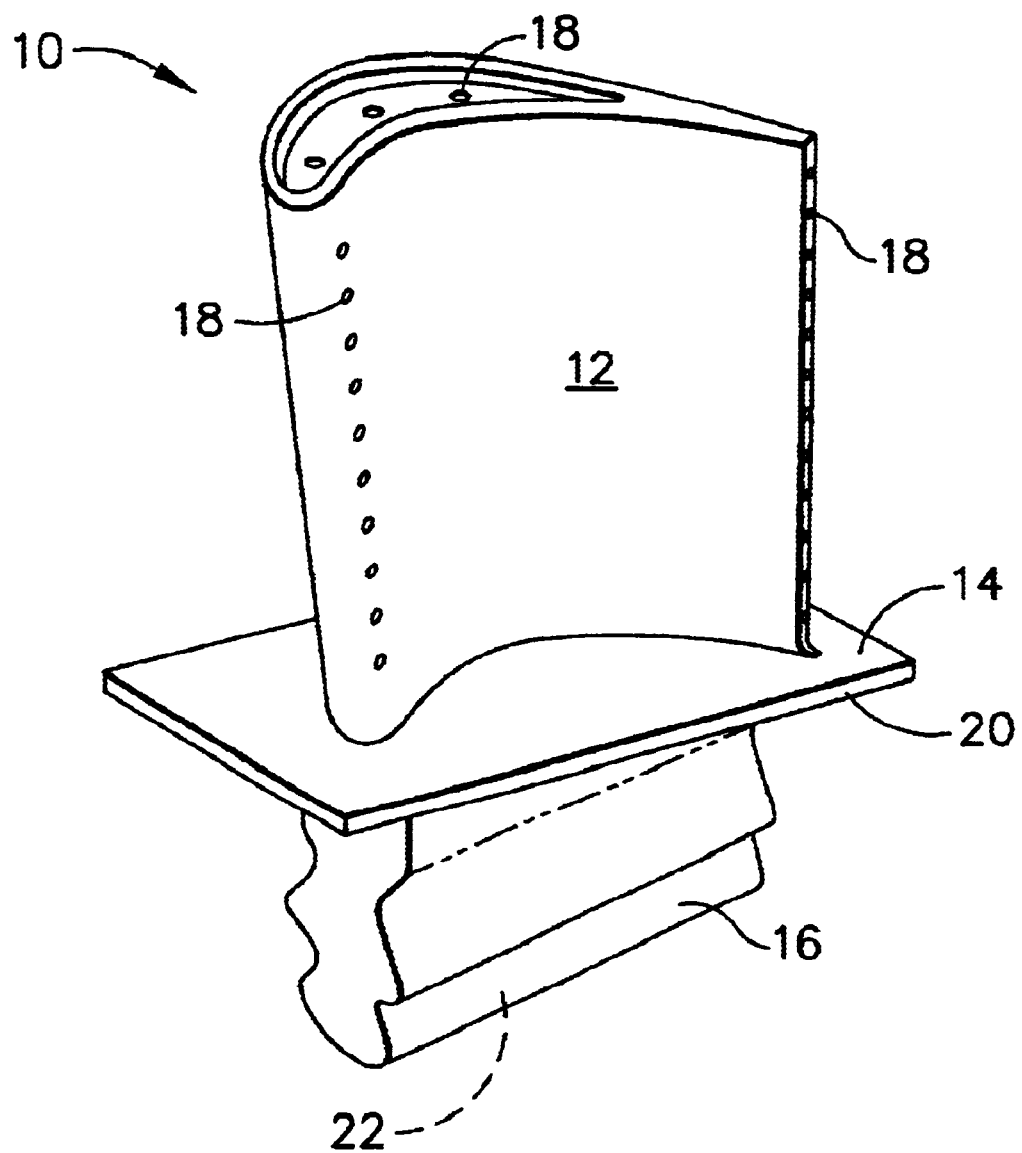
FIGS. 1 and 2 are perspective views of airfoils.
Figure 2:
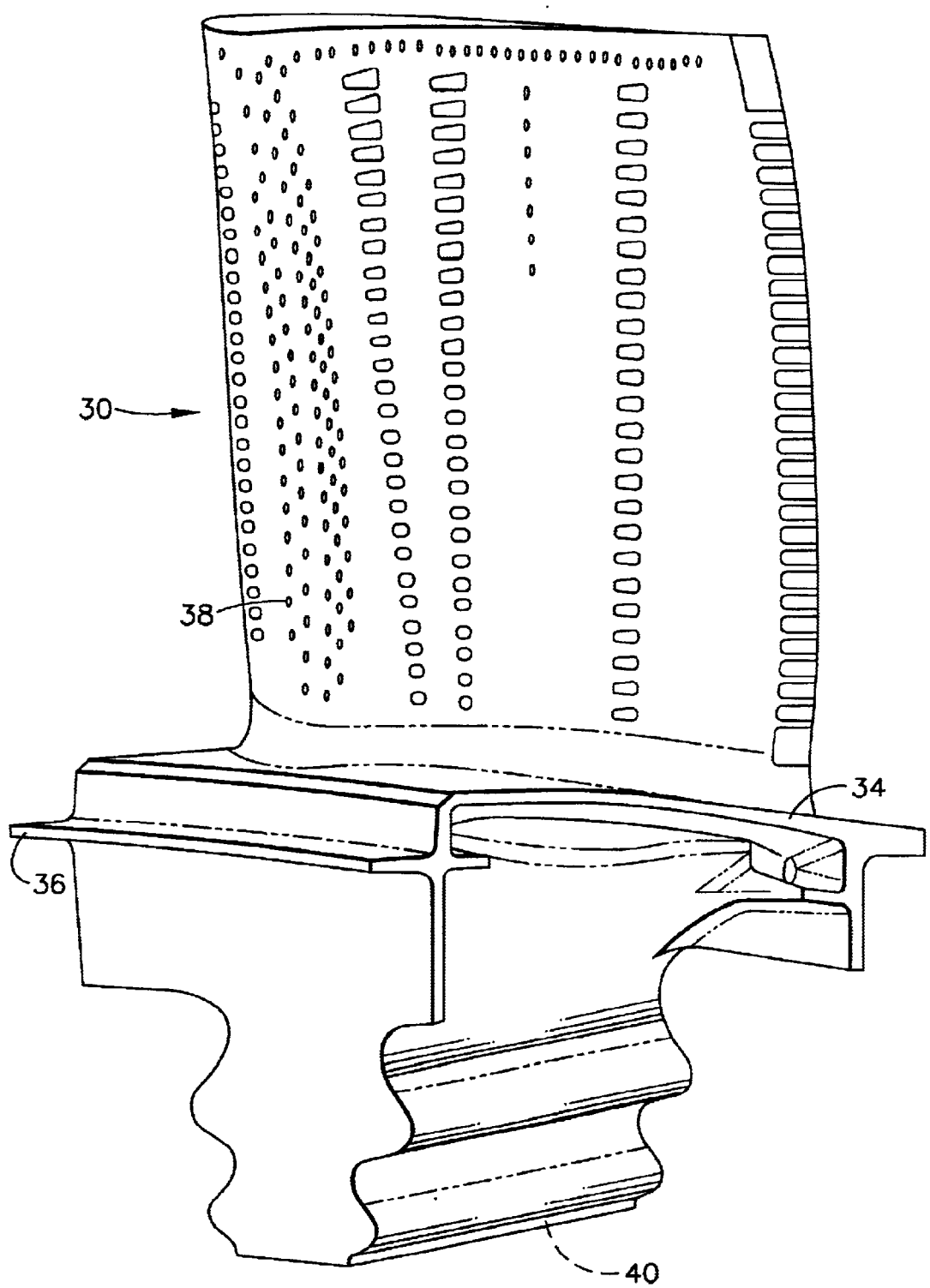
Figure 3:
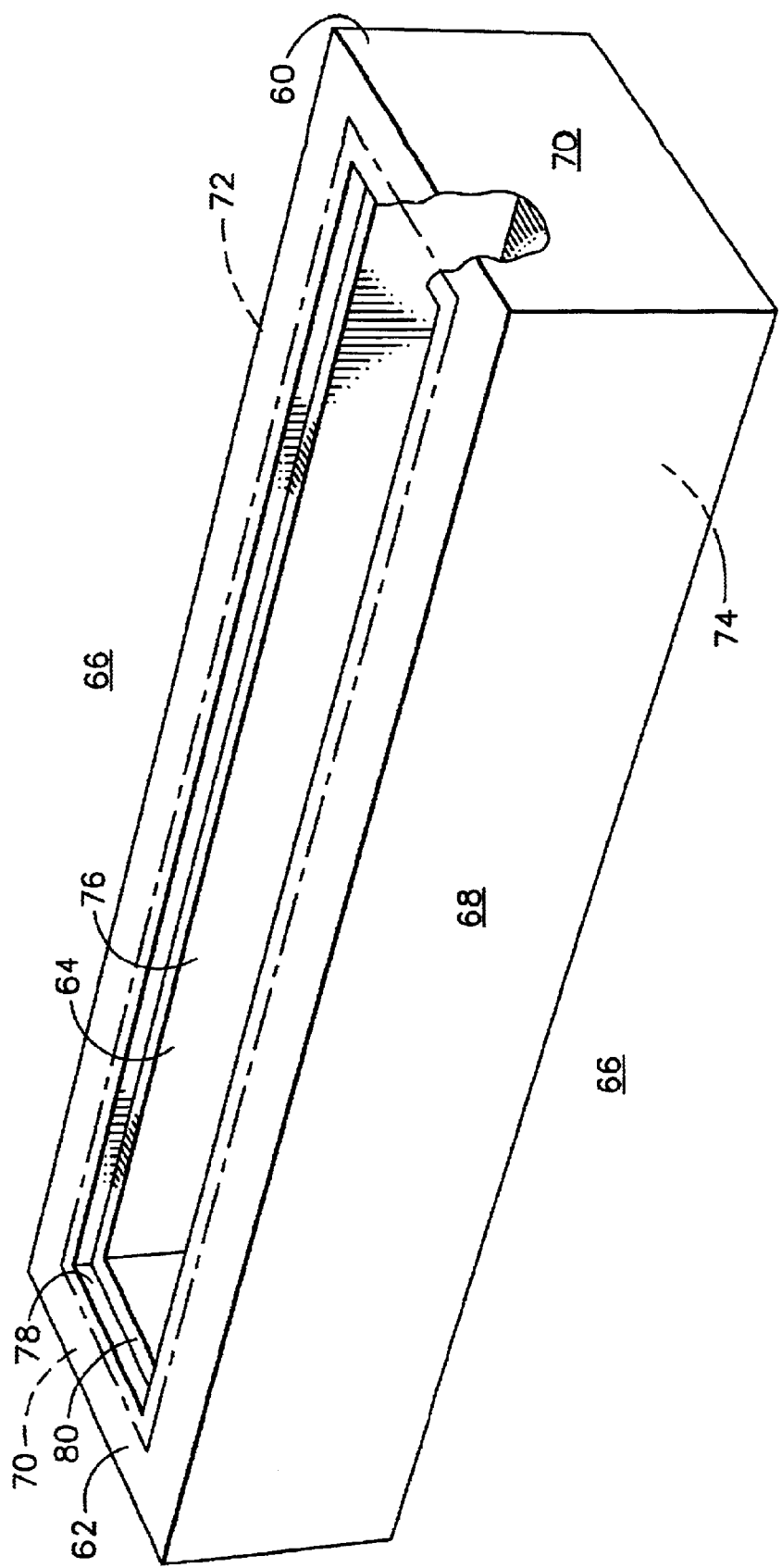
FIG. 3 is a perspective view of a dovetail receptacle of the invention.

In accordance with the process of the invention, a plurality of turbine airfoils such as airfoil 10 in FIG. 1 are placed within a special receptacle which facilitates coating of the airfoil flowpath surfaces 12, platform upper surfaces 14, and platform edges 20 of the airfoil while preventing or at least minimizing coating dovetail surfaces of the turbine airfoil. The invention is also applicable to turbine airfoils having a stepped platform configuration as with turbine airfoil 30 shown in FIG. 2, and facilitates coating the airfoil flowpath surfaces, platform upper surfaces, platform edge surfaces 34, and platform wing extension edges 36. It is also applicable to other airfoils including, for example, stator vane assemblies where it may be desirable to coat airfoil flowpath surfaces as well as inner and outer bands of the assembly. This process utilizes an airfoil dovetail section receptacle 60 (FIG. 3) which secures a plurality, preferably 10 or more, turbine airfoils during coating. The receptacle 60 forms a barrier which separates an internal volume 64 from an external volume 66. The receptacle is preferably rectangular and has a top surface 62, a front surface 68, a pair of side surfaces 70, a back surface 72, and a bottom surface 74 cooperating to define a chamber, generally designated 76. An opening at the top of the receptacle is sized and shaped to receive a series of turbine airfoils. A rim 80 extends around the opening for supporting airfoils when they are placed in the receptacle. In an alternative embodiment, bottom surface 74 is eliminated and the floor of the coating apparatus (not shown) cooperates with the side, front and back surfaces of the receptacle to define the chamber.

The dovetail receptacle is constructed from a material capable of withstanding elevated vapor phase aluminiding temperatures on the order of 1800° F.–2100° F. (980° C.–1150° C.). In the preferred embodiment, the dovetail receptacle is formed from purified graphite. Graphite is the preferred material of construction because graphite is essentially inert to aluminide coating and does not accept aluminide coating when exposed to aluminide vapor phase deposition processing.

Surfaces of the dovetail receptacle 60 are treated to avoid carburization of the turbine platforms which seat against and contact the rim 80 of the receptacle. In particular, the graphite surfaces of the receptacle which contact the airfoil are treated to avoid diffusion or other transfer of carbon from the receptacle to the airfoil. In the preferred process, this is accomplished by applying a barrier layer to rim 80 and optionally around a wall portion extending upward from the rim 80. One preferred barrier layer is an aluminum oxide spray coating layer applied to these surfaces.

Another preferred barrier layer between the edges of the receptacle and the platform edges of the airfoil is a strip of material applied to the receptacle rim 80 which contacts the turbine airfoil platform and/or platform wing extension ("angel wing") edges. In one embodiment, this is a putty or tape strip which contains metallic and/or metallic oxide powder. The strip itself acts as a physical barrier while the metallic or metallic oxide component powder serves a gettering function to attract coating vapor. The strip barrier function is accomplished, for example, by M-1 or M-7 grade putty strip available from Chromallay of Israel under the trade designation "T-Block." One advantage of this strip is that it is somewhat soft and therefore facilitates seating the turbine airfoil platform edges and/or angel wing edges therein by applying light pressure. This barrier is disposed of after each coating operation to avoid release of gettered aluminide during subsequent coating operations. The currently most preferred embodiment employs both the aluminum oxide applied barrier layer and a strip overlay.

Figure 4:
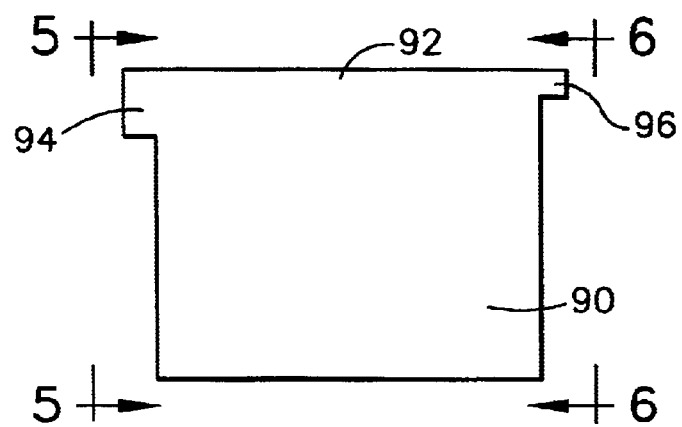
FIG. 4 is a side elevation of a spacer in accordance with the invention.
Figure 5:
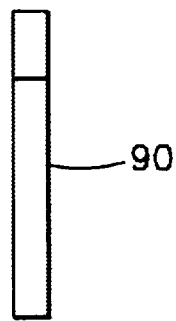
FIG. 5 is a left side elevation of the spacer of FIG. 4.
Figure 6:
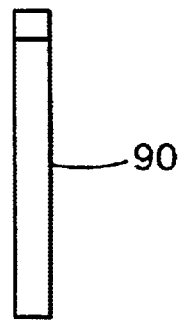
FIG. 6 is a right side elevation of the spacer of FIG. 4.
Figure 7:
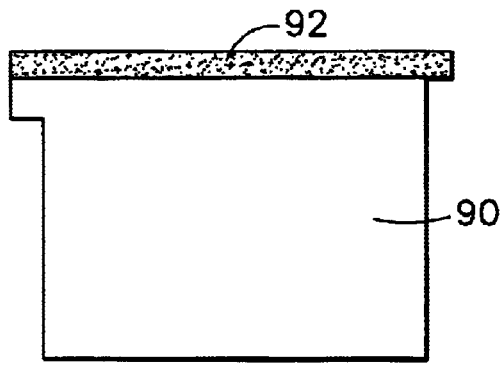
FIG. 7 is a side elevation of the spacer of FIG. 4 with a spacer barrier coating applied to a portion thereof.
Figure 8:
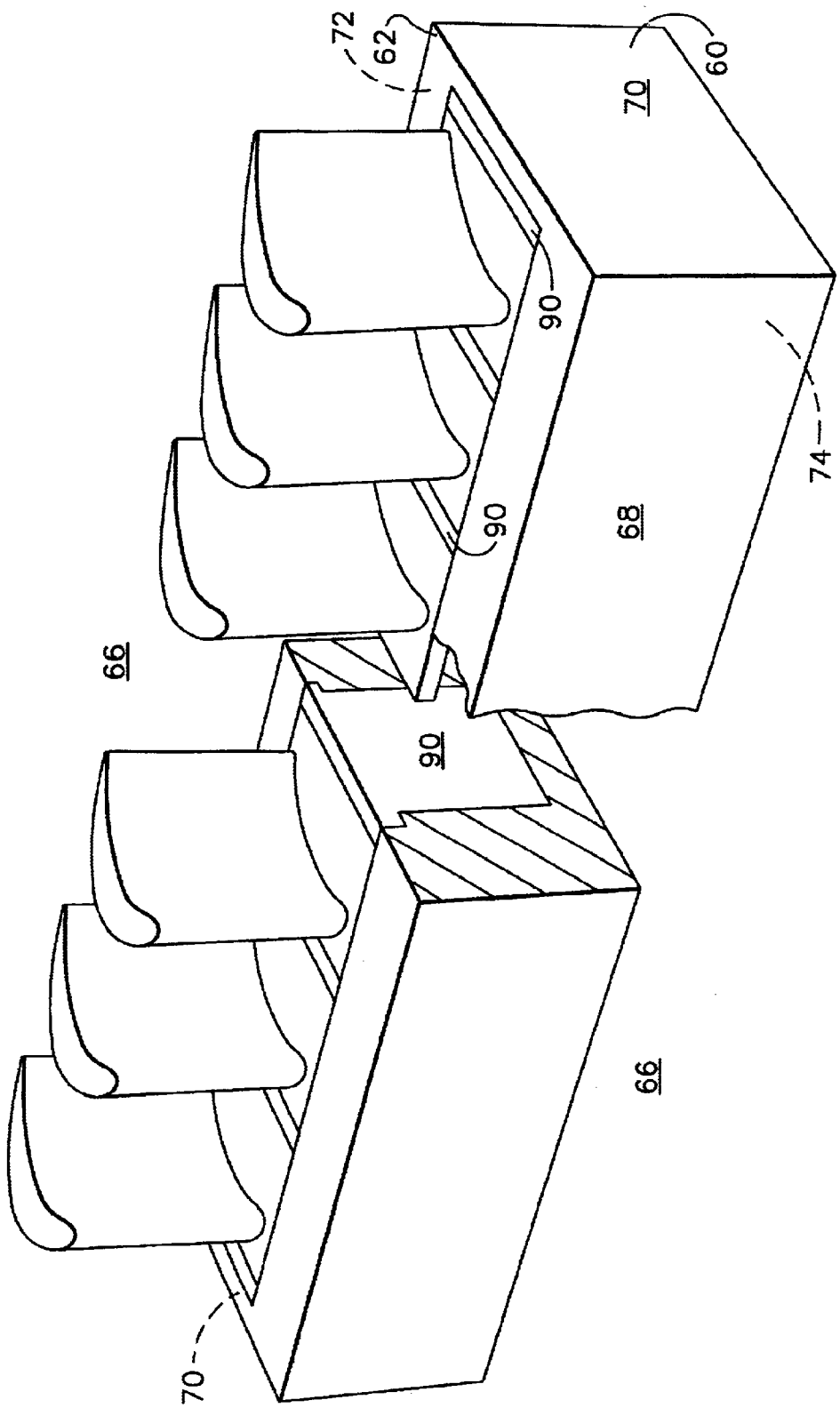
FIG. 8 is a perspective view of a turbine airfoil coating assembly according to the present invention.

In assembling a plurality of turbine airfoils into the receptacle, spacers 90 illustrated in FIGS. 4–7 are placed between each turbine airfoil and abut against the side of each airfoil at or immediately below each airfoil platform, as illustrated in FIG. 8. Inasmuch as it is desirable for the edges of the platform to be exposed to aluminide vapor during the subsequent vapor phase aluminide coating process, the spacers abut each adjacent platform so as to facilitate exposure to the vapor of the platform edges where they adjoin the platform upper surfaces while preventing vapor from traveling downward beneath the platform edges. The spacers are shaped to account for the angel wings to similarly facilitate exposure to the vapor of the angel wing side edges while preventing vapor from traveling downward beneath the angel wing edges. For example, spacer 90 has an enlarged extension 94 which is sized and shaped to abut against the lateral edge of angel wing 36 shown in FIG. 2. Spacer 90 also has an extension 96 which sized and shaped designed to abut against the extension of platform edge 34. The spacers somewhat loosely abut the platform and angel wing edges to in effect meter an amount of vapor therebetween for coating of the platform edges and angel wing edges while maintaining such metered volume of vapor sufficiently low to prevent travel of appreciable vapor below such edges. The portions of the spacers which are to abut the platform and angel wing edges of the airfoils shown at 92 in FIG. 4 are preferably coated with an aluminum oxide spray coating layer as illustrated at 92 in FIG. 7 to prevent transfer of carbon to the airfoil, similar to the manner in which certain surfaces of the receptacle are treated as described above. The spacer elements are preferably made from a material such as purified graphite which is inert to the coating vapor and is not coated thereby. Graphite is also preferred because it contracts upon heating to coating temperatures, which effect cooperates with the expansion of the airfoils upon heating, to maintain the desired relative abutment. Vapor from the vapor phase aluminide process during coating tends to enter cooling holes 18, 38 in the airfoil flowpath surface and travel down through the turbine airfoil. A quantity of this vapor traveling through interior passages (not shown) of the interior of the airfoil will then tend to exit the turbine airfoil at the base of the airfoil through openings 20, 40 at the bottom of the dovetail, which openings serve as cooling gas inlets for the airfoil in service. If such vapor is permitted to exit, it will disadvantageously coat the dovetail section of the airfoils which the invention is designed to mask. To prevent this vapor from exiting the turbine airfoil at the base of the dovetail, therefore, this invention employs a seal at the base as a barrier to this potential exit for the vapor. This seal is preferably a strip of tape or putty of a similar composition to the tape or putty described above for placement between the edges of the receptacle and the platform edges. This barrier is applied to each dovetail base prior to placement of each turbine airfoil in the receptacle. To assist in sealing this exit, it is preferable that the depth of the receptacle be sized such that the bottom of the dovetail cooperates with the bottom of the receptacle to hold the strip in place.

Successive turbine airfoils separated by spacer elements are placed in the receptacle to fill the receptacle as shown in FIG. 8 and form a complete seal between the atmosphere above the platforms and below the platforms. It is preferable that spacers also be positioned between the two outermost turbine airfoils and the ends of the receptacle.

After the turbine airfoils are assembled into the receptacle the airfoils are subjected to a conventional vapor phase aluminiding process. The components are then removed from the receptacle and brushed or water cleaned to remove residual masking media.

This process yields airfoil components having an aluminide coating on the airfoil flowpath surfaces, platform upper surfaces, the platform edges, and angel wing edges where oxidation and corrosion resistance are required, and advantageously having no coating on dovetail sections. With this new masking technique, it is possible to coat components with the vapor phase aluminide process which previously would be coated only by the codeposition process. Furthermore, the codeposition process disadvantages such as plugged holes, external and internal foreign materials, coating brittleness, labor intensity, and slow production times are avoided. The process of the invention is also superior to prior vapor phase aluminiding processes which involved grinding away aluminide coating from certain surfaces because the stresses such grinding introduces to the component are avoided. And the process permits the coating of a plurality of turbine airfoils simultaneously with a single dovetail receptacle. The new process therefore produces a better product more efficiently than the prior processes.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method for simultaneously vapor phase coating airfoil flowpath surfaces and upper platform surfaces of a plurality of turbine airfoils while masking dovetail sections of said turbine airfoils, the method comprising:

inserting dovetail sections of a plurality of turbine airfoils into a dovetail section receptacle comprising a chamber having an opening at a top of the receptacle for inserting said plurality of turbine airfoil dovetail sections into the chamber, and a rim around the opening, the rim being sized for supporting the platforms of the turbine airfoils, such that the dovetail section of each turbine airfoil extends into said chamber and the platform of each turbine airfoil rests on the rim, with upper platform surfaces and airfoil flowpath surfaces external to the receptacle;

inserting a spacer adjacent each platform of adjacent pairs of airfoils of said plurality of turbine airfoils to prevent the platforms from contacting each other;

placing the dovetail section receptacle with dovetail sections and spacers therein into a coating apparatus; and introducing coating vapor into the coating apparatus to form a coating on the airfoil flowpath surfaces and upper platform surfaces external to the dovetail receptacle while avoiding coating the dovetail sections inside the chamber.

2. The method of claim 1 wherein the spacers are constructed from graphite and comprise a barrier coating to hinder diffusion of carbon from the spacer into the turbine airfoil.

3. The method of claim 1 wherein:

a receptacle barrier coating comprising aluminum oxide is applied to the rim to hinder diffusion of carbon from the rim into the turbine airfoils;

a barrier strip is positioned to rest on the rim between the rim and the platform of each turbine airfoil to hinder diffusion of carbon from the receptacle into the turbine airfoil, wherein the barrier strip comprises a gettering component within a matrix which is soft to facilitate seating of the platforms onto the rim; and a spacer barrier coating comprising aluminum oxide is applied to at least a portion of each spacer to hinder diffusion of carbon from the spacers into the turbine airfoils.

4. The method of claim 1 wherein the dovetail section receptacle is constructed from graphite and comprises a barrier coating at said rim to hinder diffusion of carbon from the receptacle into the turbine airfoil.

5. The method of claim 4 wherein the spacers are constructed from graphite and comprise a barrier coating to hinder diffusion of carbon from the spacer into the turbine airfoil.

6. The method of claim 4 wherein the barrier coating at said rim comprises aluminum oxide.

7. The method of claim 1 wherein each turbine airfoil platform has a step thereon terminating in a platform wing extension and each spacer comprises a spacer extension which abuts each platform wing extension.

8. The method of claim 7 wherein the spacers are constructed from graphite and comprise a spacer barrier coating to hinder diffusion of carbon from the spacers into the turbine airfoils.

9. The method of claim 8 wherein the spacer barrier comprises aluminum oxide.

10. The method of claim 1 wherein the dovetail section receptacle is constructed from graphite and a barrier strip is positioned to rest on the rim between the rim and the platform of each turbine airfoil to hinder diffusion of carbon from the receptacle into the turbine airfoil.

11. The method of claim 10 wherein the barrier strip comprises a gettering component within a matrix which is soft to facilitate seating of the platforms onto the rim.

12. The method of claim 10 wherein the spacers abut the platform vertical edges in a loose manner to permit vapor to contact said edges during coating.

13. The method of claim 10 comprising a dovetail sealing strip applied to the dovetail section of each of said turbine airfoils to seal cooling gas inlets therein.

14. A method for simultaneously vapor phase coating airfoil flowpath surfaces and upper platform surfaces of a plurality of turbine airfoils while masking dovetail sections of said turbine airfoils, the method comprising:

inserting dovetail sections of a plurality of turbine airfoils into a dovetail section receptacle comprising a chamber having an opening at a top of the receptacle for inserting said plurality of turbine airfoil dovetail sections into the chamber, and a rim around the opening, the rim being sized for supporting the platforms of the turbine airfoils, such that the dovetail section of each turbine airfoil extends into said chamber and the platform of each turbine airfoil rests on the rim, with upper platform surfaces and airfoil flowpath surfaces external to the receptacle;

inserting a spacer adjacent each platform of adjacent pairs of airfoils of said plurality of turbine airfoils to prevent the platforms from contacting each other;

placing the dovetail section receptacle with dovetail sections and spacers therein into a coating apparatus; and introducing coating vapor into the coating apparatus to form a coating on the airfoil flowpath surfaces and upper platform surfaces external to the dovetail receptacle while avoiding coating the dovetail sections inside the chamber;

wherein the dovetail section receptacle is constructed from graphite and comprises a barrier coating at said rim to hinder diffusion of carbon from the receptacle into the turbine airfoil; and wherein the spacers are constructed from graphite and comprise a barrier coating to hinder diffusion of carbon from the spacer into the turbine airfoil.

15. A method for simultaneously vapor phase coating airfoil flowpath surfaces and upper platform surfaces of a plurality of turbine airfoils while masking dovetail sections of said turbine airfoils, the method comprising:

inserting dovetail sections of a plurality of turbine airfoils into a dovetail section receptacle comprising a chamber having an opening at a top of the receptacle for inserting said plurality of turbine airfoil dovetail sections into the chamber, and a rim around the opening, the rim being sized for supporting the platforms of the turbine airfoils, such that the dovetail section of each turbine airfoil extends into said chamber and the platform of each turbine airfoil rests on the rim, with upper platform surfaces and airfoil flowpath surfaces external to the receptacle;

inserting a spacer adjacent each platform of adjacent pairs of airfoils of said plurality of turbine airfoils to prevent the platforms from contacting each other;

placing the dovetail section receptacle with dovetail sections and spacers therein into a coating apparatus; and introducing coating vapor into the coating apparatus to form a coating on the airfoil flowpath surfaces and upper platform surfaces external to the dovetail receptacle while avoiding coating the dovetail sections inside the chamber;

wherein the dovetail section receptacle is constructed from graphite and a barrier strip is positioned to rest on the rim between the rim and the platform of each turbine airfoil to hinder diffusion of carbon from the receptacle into the turbine airfoil;

wherein the barrier strip comprises a gettering component within a matrix which is soft to facilitate seating of the platforms onto the rim;

wherein each turbine airfoil platform has a step thereon terminating in a platform wing extension and each spacer comprises a spacer extension which abuts each platform wing extension;

wherein the spacers are constructed from graphite and comprise an aluminum oxide spacer barrier coating to hinder diffusion of carbon from the spacers into the turbine airfoils.

* * * * *